United States Patent [19]

Kamieniecki et al.

[11] Patent Number: 5,091,691
[45] Date of Patent: * Feb. 25, 1992

[54] APPARATUS FOR MAKING SURFACE PHOTOVOLTAGE MEASUREMENTS OF A SEMICONDUCTOR

[75] Inventors: Emil Kamieniecki, Lexington; William C. Goldfarb, Melrose; Michael Wollowitz, Cambridge, all of Mass.

[73] Assignee: Semitest, Inc., Billerica, Mass.

[ * ] Notice: The portion of the term of this patent subsequent to Jan. 2, 2007 has been disclaimed.

[21] Appl. No.: 280,973

[22] Filed: Dec. 7, 1988

Related U.S. Application Data

[63] Continuation-in-part of Ser. No. 171,677, Mar. 21, 1988, Pat. No. 4,891,584.

[51] Int. Cl.$^5$ .................. G01R 31/26; H01L 31/00
[52] U.S. Cl. .................. 324/158 R; 324/158 D; 250/315.3
[58] Field of Search ............. 324/158 R, 158 D, 71.5, 324/61 P; 250/310, 305, 306, 307, 492.2, 315.3

[56] References Cited

U.S. PATENT DOCUMENTS

| | | | |
|---|---|---|---|
| 4,286,215 | 8/1981 | Miller | 324/158 R |
| 4,333,051 | 6/1982 | Goodman | 324/158 R |
| 4,433,288 | 2/1984 | Moore | 324/158 D |
| 4,544,887 | 10/1985 | Kamieniecki | 324/158 R |
| 4,551,674 | 11/1985 | Miller | 324/158 D |
| 4,663,526 | 5/1987 | Kamieniecki | 250/315.3 |

Primary Examiner—Reinhard J. Eisenzopf
Assistant Examiner—Vinh P. Nguyen
Attorney, Agent, or Firm—Irving M. Kriegsman

[57] ABSTRACT

An apparatus for making ac surface photovoltage (SPV) measurements of a specimen of semiconductor material under dc bias voltage conditions includes a light source whose output beam is intensity modulated, an adjustable dc bias voltage source, a conductive base for supporting the specimen and a novel capacitance type reference electrode assembly for sensing the SPV signals. The reference electrode assembly includes in one embodiment a button made of insulating elastomeric material and attached to a rigid plate made of insulating material. A film made of insulating material and having a conductive coating on one side which serves as a reference electrode is attached to the button. When SPV measurements are being taken, the film is pressed against the specimen with pressure sufficient to hold the reference electrode in close compliance with the specimen, with pressure being applied to the plate from an external source and being transmitted from the rigid plate to the film through the elastomeric button.

19 Claims, 12 Drawing Sheets

APPARATUS FOR MAKING SURFACE PHOTOVOLTAGE MEASUREMENTS OF A SEMICONDUCTOR

CROSS REFERENCE TO RELATED APPLICATION

This application is a continuation-in-part of U.S. patent application Ser. No. 171,677 filed on Mar. 21, 1988 now U.S. Pat. No. 4,891,584 in the names of E. Kamieniecki, W. Goldfarb and M. Wollowitz and assigned to the same assignee as this application.

BACKGROUND OF THE INVENTION

The present invention relates to an apparatus for making ac surface photovoltage measurements of a specimen of semiconductor material under dc bias voltage conditions.

Known patents relating to making surface photovoltage (SPV) measurements of semiconductors include U.S. Pat. No. 4,544,887 which issued on Oct. 1, 1985 in the name of E. Kamieniecki and which discloses a method of measuring the photo-induced voltage at the surface of a specimen of semiconductor material; U.S. Pat. No. 4,286,215 which issued on Aug. 25, 1981 in the name of G. L. Miller and which discloses a method and apparatus for the contactless monitoring of the carrier lifetime in semiconductor materials; U.S. Pat. No. 4,333,051 which issued on June 1, 1982 in the name of A. M. Goodman and which discloses a method and apparatus for determining minority carrier diffusion length in semiconductors; U.S. Pat. No. 4,433,288 which issued on Feb. 21, 1984 in the name of A. R. Moore and which discloses a method and apparatus for determining minority carrier diffusion length in semiconductors; and U.S. Pat. No. 4,663,526 which issued on May 5, 1987 in the name of E. Kamieniecki and which discloses a method and apparatus for the nondestructive readout of a latent electrostatic image formed on an insulating material.

Known publications relating to making surface photovoltage measurements of semiconductors include Emil Kamieniecki, "Surface Photovoltage Measured Capacitance: Application To Semiconductor/Electrolyte System", J. Appl. Phys. Vol. 54, No. 11, November, 1983, pp. 6481-6487; Emil Kamieniecki, "Determination of surface space charge capacitance using a light probe", J. Vac. Sci. Technol., Vol. 20, No. 3, March, 1982, pp. 811-814; Hiromichi Shimizu, Kanji Kinameri, Noriaki Honma and Chusuke Munakata, "Determination of Surface Charge and Interface Trap Densities in Naturally Oxidized n-Type Si Wafers Using ac Surface Photovoltages", Japanese Journal of Applied Physics, Vol. 26, No. 2, February, 1987, pp. 226-230; A. Sher, Y. H. Tsuo, John A. Moriarty, W. E. Miller and R. K. Crouch, "Si and GaAs Photocapacitive MIS Infrared Detectors", J. Appl. Phys., Vol. 51, No. 4, April 1980, pp. 2137-2148; Olof Engstrom and Annelle Carlsson, "Scanned Light Pulse Technique For the Investigation of Insulator-semiconductor Interfaces", J. Appl. Phys. Vol. 54, No. 9, September, 1983, pp. 5245-5251; E. Thorngren and O. Engstrom, "An Apparatus for the Determination of Ion Drift in MIS Structures", J. Phys. E: Sci, Instrum., Vol. 17, 1984, printed in Great Britain, pp. 1114-1116; E. Kamieniecki and G. Parsons, "Characterization of Semiconductor-Electrolyte System by Surface Photovoltage Measured Capacitance", 164th meeting of the Electrochemical Society, Washington, D.C. October, 1983; R. R. Chang, D. L. Lile and R. Gann, "Remote Gate Capacitance-Voltage Studies for Noninvasive Surface Characterization", Appl. Phys. Lett. Vol. 51, No. 13, Sept. 28, 1987, pp. 987-989; Chusuke Munakata, Shigeru Nishimatsu, Noriaki Honma and Kunihiro Yagi, "AC Surface Photovoltages in Strongly-Inverted Oxidized p-Type Silicon Wafers", Japanese Journal of Applied Physics, Vol 23, No. 11, November 1984, pp. 1451-1461; R. S. Nakhmanson, "Frequency Dependence of the Photo-EMF of Strongly Inverted Ge and Si MIS Structures - I. Theory", Solid State Electronics, 1975, Vol 18, pp. 617-626, Pergamon Press, Printed in Great Britain; R. L. Streever, J. J. Winter and F. Rothwarf, "Photovoltage Characterization of MOS Capacitors", Proc. Int. Symp. Silicon Materials Sci & Tech., Philadelphia, May 1977 (Electrochem. Soc. Princeton, 1977) pp. 393-400; R. S. Nakhmanson, Z. Sh. Ovsyuk and L. K. Popov, "Frequency Dependence of Photo-EMF of Strongly Inverted Ge and Si MIS Structures - II Experiments", Solid State Electronics, 1975, Vol. 18, pp. 627-634 Pergamon Press, Printed in Great Britain; Chusuke Munakata and Shigeru Nishimatsu, "Analysis of ac Surface Photovoltages in a Depleted Oxidized p-Type Silicon Wafer", Japanese Journal of applied Physics, Vol 25, No. 6, June, 1966, pp. 807-812; Chusuke Munakata, Mitsuo Nanba and Sunao Matsubara, "Non-Destructive Method of Observing Inhomogeneities in p-n Junctions with a Chopped Photon Beam", Japanese Journal of Applied Physics, Vol. 20, No. 2, February, 1981, pp. L137-L140; Chusuke Munakata and Shigeru Nishimatsu, "Analysis of ac Surface Photovoltages in a Depleted Oxidized p-Type Silicon Wafer", Japanese Journal of Applied Physics, Vol 25, No. 6, June, 1986, pp. 807-812; S. M. Sze, "MIS Diode and Charge-Coupled Device", Physics of Semiconductor Devices, John Wiley & sons Inc. New York 1981, second edition, pp. 362-394.

In copending U.S. patent application Ser. No. 145,943 filed on Jan. 20, 1988 in the name of E. Kamieniecki and assigned to the assignee of this application there is disclosed a method and apparatus for the characterization of a specimen of semiconductor material which involves making ac surface photovoltage measurements under bias voltage conditions. The apparatus includes a reference electrode, a back electrode, an insulator, a light source whose output is intensity modulated and an adjustable dc bias voltage source. The reference electrode is a rigid structure in the form of conductively coated glass plate having an area at least as large as the specimen of semiconductor material. The back electrode is a sheet of conductive material, such as aluminum foil, and is fixed to a rubber pad which is attached to a mechanical press. The insulator is a free standing element in the form of a sheet of transparent flexible dielectric material, such as mylar. The insulator and the back electrode are at least equal in size (area) to the semiconductor. In use, the specimen is positioned between the back electrode and the reference electrode, with the reference electrode being electrically separated from the specimen by the insulator so as to provide a capacitance type of pickup. The modulated light beam from the light source is focussed through the reference electrode and insulator to a spot on the semiconductor surface and its location on the semiconductor surface adjusted by a scanning mechanism. When the SPV measurements are being taken, the semiconductor is pressed up against the insulator by pressure applied by the mechanical press through the rubber pad, the pressure being sufficient to insure close compliance between the specimen and the reference electrode. As the bias voltage, which is applied between the back electrode and the reference electrode, is varied over a wide range (i.e. from about 0 volts up to about 500 volts), the ac surface photovoltage signals which are stimulated by the intensity modulated beam of light are picked up between the back electrode and the reference electrode and fed into the electronics part of the apparatus for processing.

According to the method described in the above noted pending patent application for characterizing properties of the specimen being examined, the surface photovoltage is measured under certain defined conditions. The defined conditions of measurement are as follows: (1) the wavelength of the illuminating light is shorter than that corresponding to the energy gap of the semiconductor material, and (2) the light is intensity modulated with the intensity of the light and the frequency of modulation being selected such that the induced (ac) voltage signal is directly proportional to the intensity of light and reciprocally proportional to the frequency of modulation. When measured under these conditions, the surface photovoltage is proportional to the reciprocal of the semiconductor space charge capacitance. If the surface of the specimen is illuminated uniformly this relationship may be expressed as $$\delta V_s = \frac{\phi(1-R)}{Kf} qC_{sc}^{-1} \quad (1)$$

where $\delta V_s$ is the surface photovoltage, $C_{sc}$ is the space charge capacitance. $\phi$ is the incident photon flux, R is the reflection coefficient of the semiconductor material, f is the modulation frequency of the light, and q is the electron charge. K is equal to 4 for squarewave modulation of light intensity and is equal to $2\pi$ for sinusoidal modulation. If the illumination of the semiconductor surface is local and not uniform, $\delta V_s$ is first determined by using the equation $\delta V_m = (s/S)\delta V_s$ where $V_m$ is the measured voltage, s is the area of the illuminated portion (plus diffusion) and S is the total area of the semiconductor. The semiconductor space charge capacitance $C_{sc}$ is then determined using equation (1) noted above.

Apparatus as described in the above noted pending patent application has been constructed in the laboratory. Recurrent problems with the apparatus as constructed have been caused by the conflicting needs to (i) apply sufficient pressure to hold the insulator motionless during the sweep of the bias field voltage and maintain the reference electrode in close compliance (i.e. locally parallel relationship) with the semiconductor and (ii) avoid high voltage breakdown of the insulator which may become damaged by the physical holding forces and dust particles and/or breakage or contamination of the semiconductor itself. Insulator motion during the bias sweep is caused by the electrostatic forces produced by the bias field. These forces may cause the insulator to move, changing the distance between the reference electrode and the semiconductor during the bias sweep. Changes in the distance between the reference electrode and the semiconductor will cause local variations in the coupling capacitance (i.e. the capacitance between the reference electrode and the specimen) and therefore disturb output photovoltage signal.

Such changes may also cause modulation of the optical interference fringes in the narrow gaps between the insulator, the specimen and reference electrode. This light intensity modulation can distort the results and render it uninterpretable.

As can be seen, there is a need for a new arrangement for detecting ac surface photovoltage signals in a specimen of semiconductor material, especially under high bias voltage conditions.

Accordingly, it is an object of this invention to provide a new and improved apparatus for making ac surface photovoltage measurements of a specimen of semiconductor material;

It is another object of this invention to provide a new and improved apparatus for making ac surface photovoltage measurements of a specimen of semiconductor material under dc bias voltage conditions.

It is still a further object of this invention to provide a new and improved capacitive type reference electrode for use in making ac surface photovoltage measurements of a specimen of semiconductor material.

It is yet a further object of this invention to provide a new and novel reference electrode assembly which is especially constructed for use in an apparatus for making ac surface photovoltage measurements of a specimen of semiconductor material under high dc bias voltage conditions.

The present invention overcomes the difficulties noted above with the apparatus described in the above noted patent application.

SUMMARY OF THE INVENTION

According to this invention there is provided an apparatus for making ac surface photovoltage measurements of a specimen of semiconductor material under dc bias voltage conditions. The apparatus includes a flexible reference electrode assembly. In one version, the flexible reference electrode assembly includes a reference electrode which is a coating on a film (i.e. a flexible thin sheet) of insulating material. When SPV measurements are being made, the reference electrode is held in close compliance with the surface of the specimen by pressure which is transmitted to the reference electrode through a fluid. In a modification, the pressure is transmitted to the reference electrode through an elastomeric button. Several embodiments of the button are disclosed. In another version the flexible reference electrode assembly includes a reference electrode which is a coating formed on a rigid plate which in turn is mounted on a flexible supporting frame. When the SPV measurements are being made, the reference electrode is brought into close compliance with the specimen through a magnetic field produced by an electromagnet. In another version, the flexible reference electrode assembly includes a reference electrode which is a coating formed on a rigid plate which in turn is mounted on a flexible supporting frame, the frame having a plurality of piezoelectric actuators. When the SPV measurements are being made, the reference electrode is maintained at a precise distance from the specimen and locally parallel to the specimen by selectively energizing the piezoelectric actuators.

According to another aspect of the invention, the reference electrode is made much smaller in size than the specimen.

According to still another aspect of the invention, a guard electrode is included for limiting fringing field problems in the application of the bias field, for defining more clearly the area of the specimen from which the SPV signals are received and for making easier the calibration of the surface space charge capacitance relationship to the photovoltage signals detected.

Various features and advantages of the invention will appear from the description to follow. In the description, reference is made to the accompanying drawing which forms a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

Figure 1:
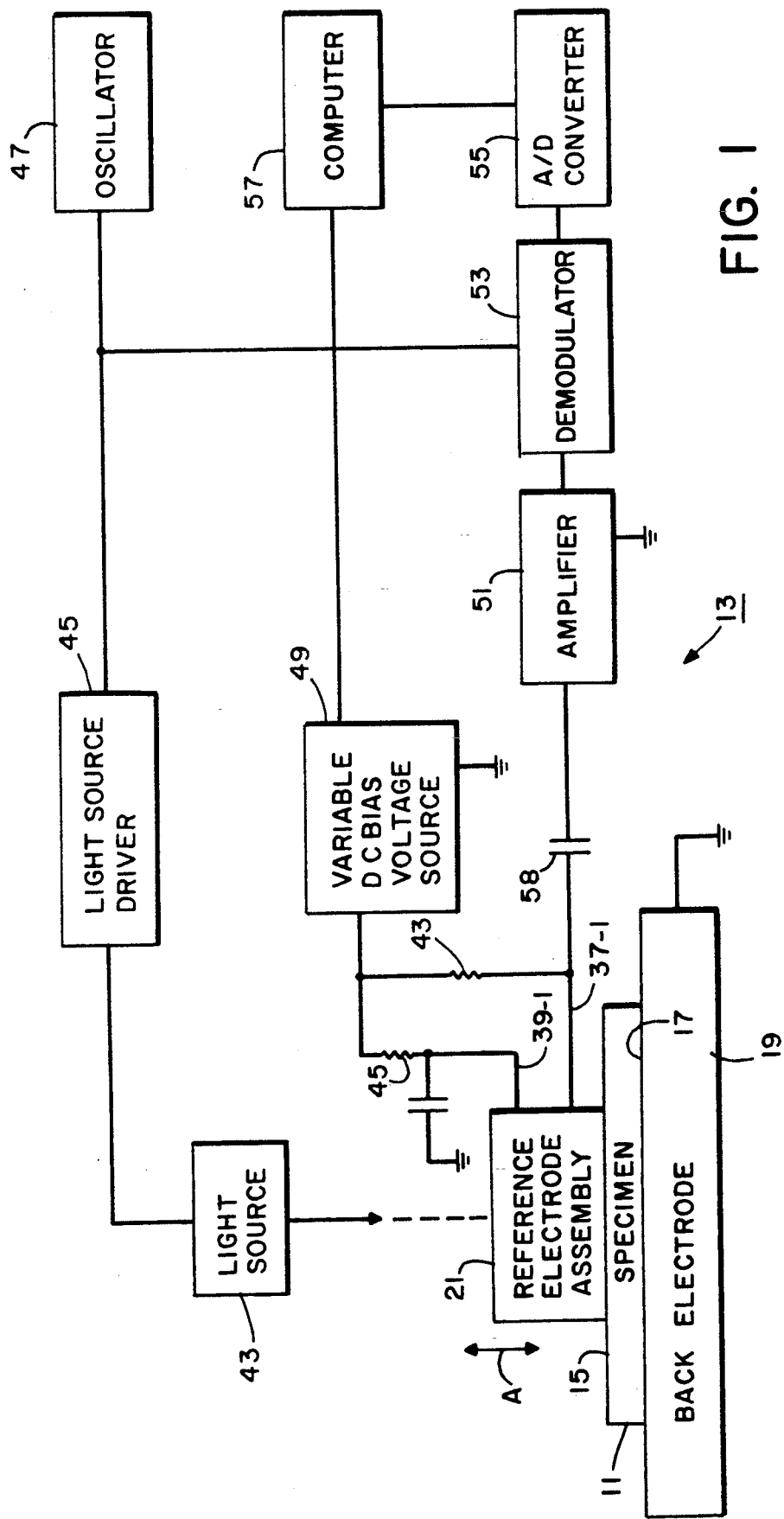
FIG. 1 is a schematic illustration of an apparatus for making ac surface photovoltage measurements of a specimen of semiconductor material under bias voltage conditions constructed according to the teachings of the present invention.

Referring now to the drawings, there is shown in FIG. 1 a simplified schematic illustration of an apparatus constructed according to this invention for making ac surface photovoltage measurements of a specimen of semiconductor material. In the illustration, the specimen of semiconductor material is identified by reference numeral 11 and the apparatus is identified by reference numeral 13.

Specimen 11 has two major surfaces 15 and 17, respectively, surface 15 being the surface under testing. Specimen 11 may comprise a slab of silicon in a wafer configuration. An oxide coating (not shown) may be on surface 15.

Apparatus 13 includes a back electrode 19 and a capacitive pickup type reference electrode assembly 21. Back electrode 19, which also serves as a base or support for specimen 11, is a rigid member made of a conductive metal, such as aluminum. As can be seen, specimen 11 is seated on back electrode 19 with surface 15 facing upward (at the top in FIG. 1) and surface 17 in contact with back electrode 19 (at the bottom in FIG. 1). Back electrode 19 is connected to ground. Back electrode 19 is stationary while reference electrode assembly 21 is movable vertically relative to back electrode 19, as shown by arrows A, so that it can be lowered into contact with specimen 11 for testing and then raised after the measurements have been taken. Alternatively, (not shown) reference electrode assembly 21 could be stationary and back electrode 19 movable vertically relative to reference electrode assembly 21.

Figure 2:
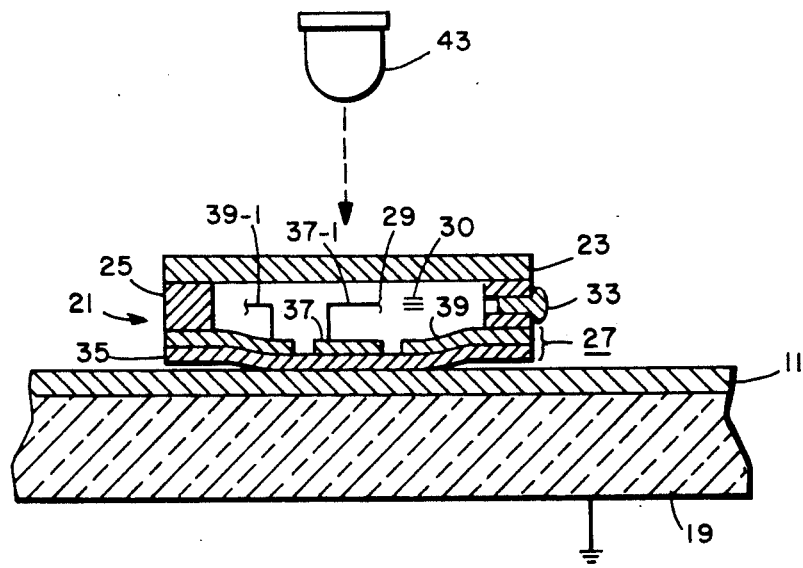
FIG. 2 is a schematic of the light source, the back electrode and the reference electrode assembly in the apparatus shown in FIG. 1.

Reference electrode assembly 21, which is also shown in FIG. 2, incldues a flat plate 23 of rigid transparent material, such as glass. An annularly shaped spacer 25 made of a rigid material is fixedly attached to the bottom side of flat plate 23, plate 23 and spacer 25 defining a frame. A flexible diaphragm 27 is fixedly attached to the bottom side of spacer 25, the area between diaphragm 27, spacer 25 and plate 23 constituting an air tight chamber 29. Chamber 29 is filled with a quantity of fluid 30, such as air, which is under pressure. A port 31, which is formed in spacer 25 and which is covered by a removable plug 33 permits access to chamber 29, when desired.

Figure 3:
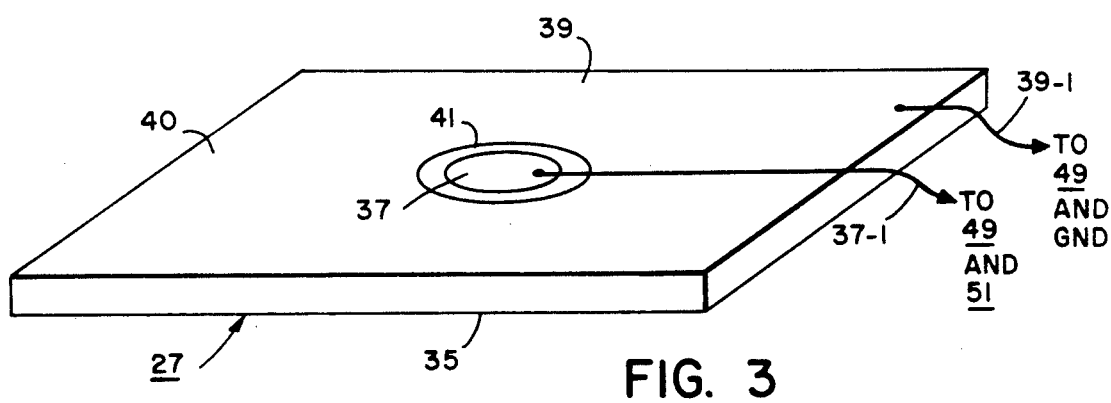
FIG. 3 is a perspective view of the diaphragm in the reference electrode assembly shown in FIG. 2.
Figure 3A:
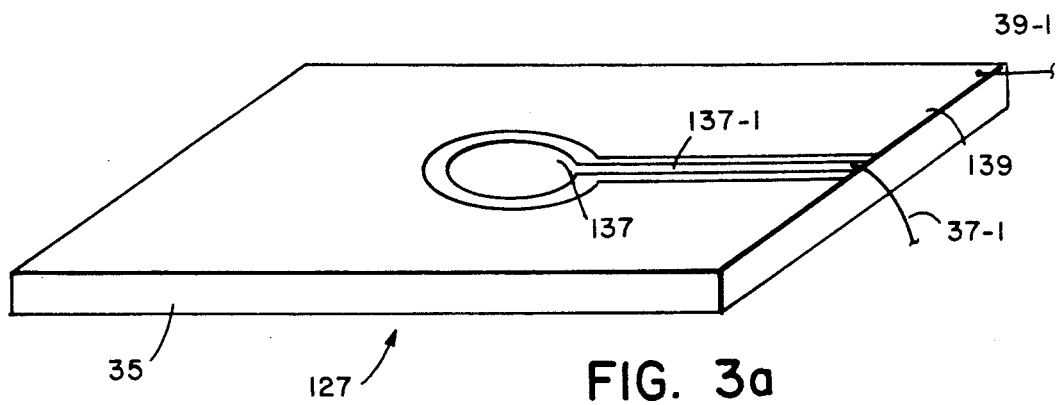
FIG. 3(a) is a modification of the diaphragm shown in FIG. 2.

Diaphragm 27, which is also shown in FIG. 3, comprises a film 35 (i.e. a thin flexible sheet) of flexible transparent dielectric material, such as mylar. Sheet 35, which serves as an insulator, is smaller in size than specimen 11. A pair of coatings 37 and 39 of conductive material are formed on the top surface 40 of insulator 35 by any suitable means, such as deposition. Coating 37 is circular in shape and serves as a reference electrode. Coating 39 surrounds coating 37 but is separated from coating 37 by an annular shaped uncoated area 41 and serves as a guard electrode. Both coatings 37 and 39 may be made of aluminum. The thickness of coating 37 is such that it is transparent. Reference electrode 37 is much smaller than specimen 11. As can be seen, insulator 35 electrically separates coatings 37 and 39 from specimen 11. A conductor 37-1 is connected to electrode 37 and a conductor 39-1 is connected to electrode 39. An alternate arrangement of diaphragm 27 is shown in FIG. 3(a) and is identified by reference numeral 127. Diaphragm 127 includes reference and guard electrodes 137 and 139, respectively which are formed on sheet 35. Reference electrode includes a thin stripe 137-1 which extends to the edge of diaphragm 127 and coating 139 surrounds but is spaced from coating 137. Conductor 37-1 is attached to the outer end of strip 137-1.

Referring back to FIG. 1, apparatus 13 further includes a light source 43, a light source driver 45, an oscillator 47, a variable dc bias voltage source 49, an amplifier 51, a demodulator 53, an analog to digital A/D converter 55 and a computer 57.

Light source 43 is fixed in the x-y (i.e. horizontal) direction relative to reference electrode assembly 21 and positioned so that the light beam is vertically aligned with reference electrode 37.

Light source 43 is separate from reference electrode assembly 21, but may if desired be attached to reference electrode assembly 21 by a frame (not shown).

In using apparatus 13, specimen 11 is placed on back electrode 19 as shown. Reference electrode assembly 21 is then moved vertically down so that reference electrode 37 is in close proximity to specimen 11. Reference electrode assembly 21 is then pressed down against specimen 11 by any suitable external means (not shown) with sufficient pressure so that reference electrode 37 is in close compliance (i.e. parallel relationship) with surface 15 of specimen 11, the pressure being transmitted from plate 23 to reference electrode 37 through the fluid in chamber 29. Since reference electrode 37 is formed on the top surface of insulator 35 it does not actually come into contact with specimen but rather forms a capacitance type of pickup. A beam of light from source 43 is then directed through flexible reference electrode assembly 21 onto front surface 15 of specimen 11 to generate the SPV signals. As can be appreciated, the light beam from source 43 will pass through reference electrode 37 since it is transparent. Source 43, which may be a light emitting diode, is driven by light source driver 45 which modulates the light beam that is emitted. Light source driver 45 is driven by oscillator 47. A variable dc bias voltage of from about 0 to about 500 volts is applied to reference electrodes 37 and 39 from variable dc bias voltage source 49, the voltage being applied through separation resistors 43 and 45, respectively. The ac photovoltage signals developed across the surface 15 of specimen 11 upon illumination as the bias voltage from source 49 is varied are capacitively picked up by reference electrode 37 and fed through an isolation capacitor 58 into amplifier 51. Signals picked up by guard electrode 39 are shunted to ground. As can be appreciated, guard electrode 39 serves to avoid fringing field problems in the application of the bias field and also serves to limit the area on surface 15 of specimen 11 that provides the SPV signal to reference electrode 37. The output of amplifier 51 is fed into demodulator 53. The output of demodulator 53 is fed into A/D converter 55 whose output is fed into computer 57. Bias voltage source 49 may be, for example, in the form of a voltage ramp generator or an amplifier with the ramp supplied by computer 57.

If desired, an insulator of appropriate material and thickness (not shown) may be placed between specimen 11 and back electrode 19 for protective purposes.

Figure 4:
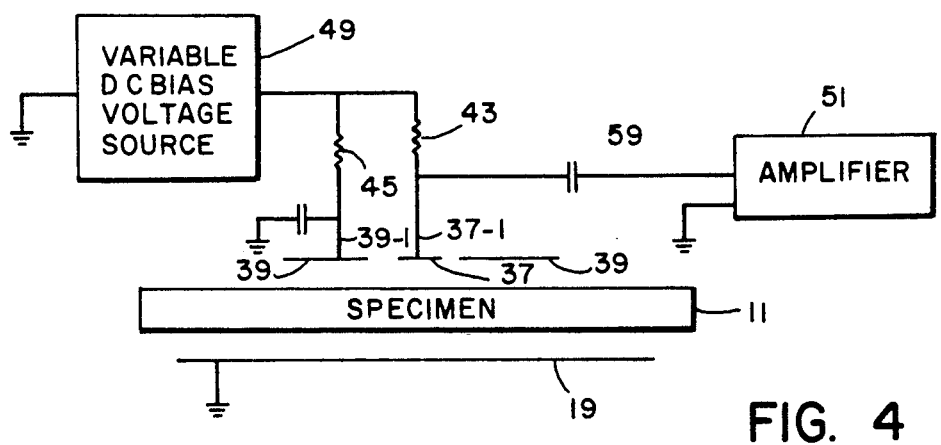
FIG. 4 is an electrical schematic useful in understanding how the guard electrode and the reference electrode in the diaphragm shown in FIG. 3 are interconnected.

An electrical schematic showing how reference electrode 37 and guard electrode 39 are interconnected is shown in FIG. 4. As can be seen, guard electrode 39 is electrically isolated from reference electrode 37 but is at the same dc potential as reference electrode 37.

After the SPV measurements have been made, assembly 21 is raised.

Instead of having a fixed pressure inside chamber 29. A pump for selectively increasing the pressure could be connected to chamber 29. In this case, assembly 21 would be brought close to specimen 11 and the pressure increased to push diaphragm 27 against specimen 11 to insure uniform compliance between electrode 37 and specimen 11 and then decreased after the testing has been completed.

The pickup arrangement shown in FIG. 1 for sensing the SPV signals has many advantages which are readily apparent.

For example, by making the reference electrode a flexible rather than a rigid type of structure, the reference electrode can be bent to conform to the shape of the specimen to achieve uniform compliance with the specimen rather than having to make the specimen conform to the shape of the reference electrode. Also, by making the reference electrode flexible, the pressure that must be applied to obtain close compliance between the reference electrode and the specimen is less than it would be if it were rigid. Also, if the pressure that must be applied to insure compliance between the reference electrode and specimen is reduced the likelyhood of damaging the specimen and/or the insulator on which the reference electrode is formed will be reduced.

By making the reference electrode smaller than the specimen, several benefits are also realized. First, and most important, since the SPV signal-to-noise (S/N) ratio depends mainly on the ratio of the mutual capacitance between the illuminated part of the specimen and the reference electrode and the total mutual capacitance between the specimen and the reference electrode, if the reference electrode is made smaller relative to the specimen and the size of the illuminating light beam is not changed, the SPV signal to noise ratio will be made larger. If amplifier 51 is a voltage amplifier then the S/N ratio will increase since the signal will increase and if amplifier 51 is a current amplifier the S/N ratio will increase since the noise will decrease. Also, if the reference electrode is reduced in size, the pressure needed to achieve compliance of the specimen to the reference electrode surface may be reduced. Also, by making the reference electrode smaller than the semiconductor, the insulator can also be made smaller and will consequently be easier to keep clean and dust free. Also, if the reference electrode is small relative to the specimen, then the corresponding insulator area exposed to high voltage stress will be reduced, thus minimizing the likelyhood of high voltage breakdown. Damage and contamination of the specimen will also be reduced. Also, if the SPV signal to noise ratio is increased, then the SPV signals can be measured for less time and the insulator will be less liable to high voltage breakdown. Furthermore, by making the reference electrode small, accommodation of the apparatus to specimens of various sizes is simpler. Also, by making the insulator smaller than the specimen, then only a portion of the specimen surface will actually be touched by the insulator at any one time.

Figure 5:
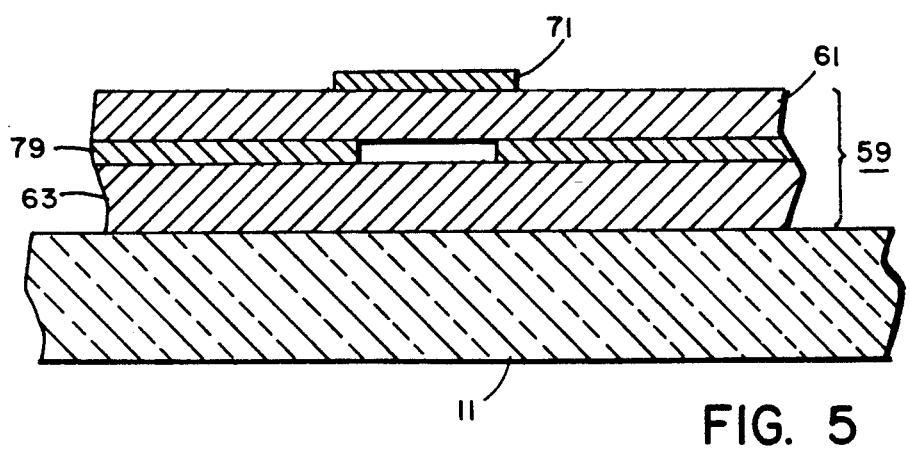
FIG. 5 is a section view of a modification of the diaphragm shown in FIG. 3.
Figure 6:
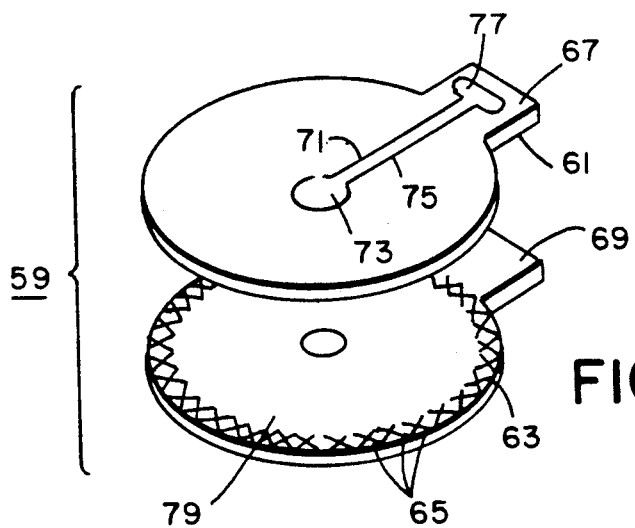
FIG. 6 is an exploded perspective view of the diaghragm shown in FIG. 5.

In FIGS. 5 and 6 there is shown another modification of construction of diaphragm 27, the modification being identified by reference numeral 59. Also shown in FIG. 5 is specimen 11. As can be seen, diaphragm 59 comprises two substantially disc shaped sheets 61 and 63 of transparent, flexible, dielectric material instead of a single sheet as in diaphragm 27. Sheets 61 and 63 are stacked one on top of the other and fixedly secured around at their outer edges by an adhesive 65, such as glue. Each sheet 61, 63 includes a peripheral tab area, 67 and 69, respectively. Sheets 61 and 63 may be made of mylar or other equivalent material.

Sheet 61, which is the upper sheet, has a transparent conductive coating 71 on its top surface. Coating 71 is shaped to define a small circular area 73 at the center of the sheet which serves a reference electrode, a rectangular area 75 on tab 67 which serves as an electrical contact and a narrow strip 77 for connecting area 73 to area 75. Lower sheet 63 has a nontransparent conductive coating 79 which covers the entire top surface, including the tab area 69, except for a small circular area 81 at the center which is slightly smaller in size than area 73. Sheets 61 and 63 are stacked so that area 73 is in registration with area 81. Conductive coating 79 on sheet 63 serves as a guard electrode. Coatings 71 and 79 may both be aluminum. Coating 71 is of appropriate thickness so as to be transparent. As can be seen, reference electrode 73 is much smaller in size than specimen 11.

Figure 6A:
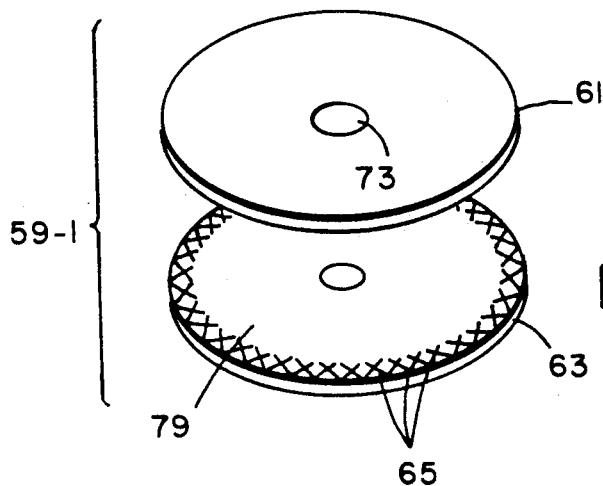
FIG. 6a is a view of a modification of the diaphragm shown in FIG. 6.

In FIG. 6(a) there is shown a modification 59-1 of diaphragm 59, the difference being that in diaphragm 59-1 the stripe 71 and the tab portion have been omitted.

Figure 7:
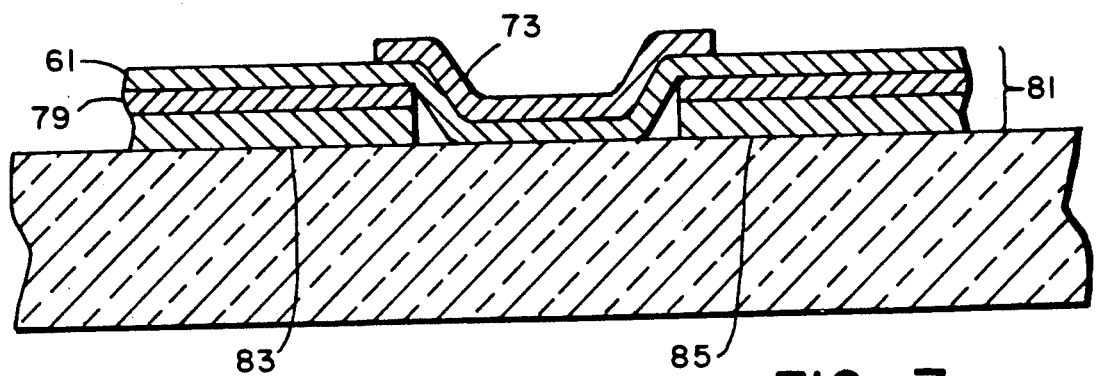
FIG. 7 is a section view of another modification of the diaphragm shown in FIG. 5.

In FIG. 7 there is shown another modification of diaphragm 59, the modification being identified by reference numeral 81. Also shown in FIG. 7 is specimen 11. Diaphragm 81 differs from diaphragm 59 in that sheet 83, which is the bottom sheet, has a circular hole 85 at the center rather than a circularly shaped uncoated area at the center as with sheet 63. Except for hole 85, bottom sheet 83 is identical to bottom sheet 63. When diaphragm 81 is pushed in the direction of specimen 11, the center of top sheet 61 will partly extend through bottom sheet at hole 85, as shown. Diaphragm 59-1 may be modified in a similar manner.

Figure 8:
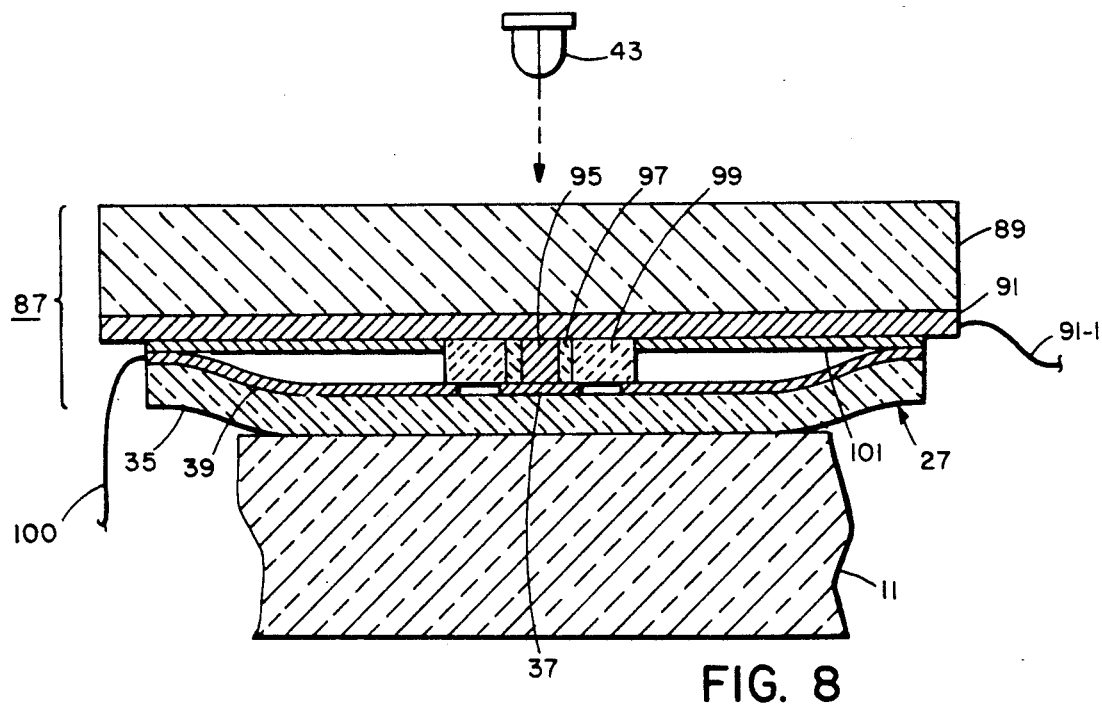
FIG. 8 is a schematic illustration of a modification of the embodiment shown in FIG. 2.

In FIG. 8 there is shown a modification of reference electrode assembly 21 wherein pressure is transmitted to the diaphragm to maintain the reference electrode in compliance with the specimen through an elastomeric button rather than through a fluid, the modification being identified by reference numeral 87. Also shown in FIG. 8 is specimen 11 and light source 43.

Figure 9:
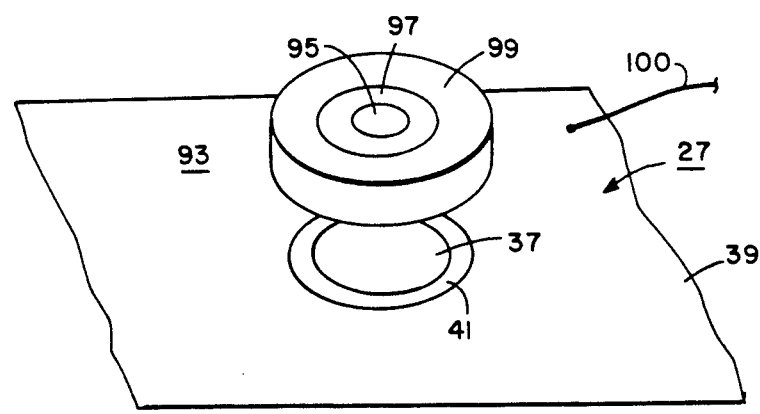
FIG. 9 is an exploded perspective view of the diaphragm and the elastomeric button in the reference electrode assembly shown in FIG. 8.

Reference electrode assembly 87, parts of which are also shown in FIG. 9, includes a flat rigid transparent plate 89, such as glass, having a transparent conductive coating 91 on its bottom surface. Reference electrode assembly 87 also includes a flexible diaphragm 27. Diaphragm 27 is disposed below plate 89. A flexible and deformable button 93 is disposed between plate 89 and diaphragm 27. Button 93 includes an inner section 95 which is circular in cross-section and made of a transparent elastomer, an intermediate section 97 which is annularly shaped in cross section, surrounds inner section 95 and is made of an elastomer that is conductive and opaque and an outer section 99 which is ring shaped in cross section, surrounds intermediate section 97 and is made of an elastomer that is insulating and opaque. A conductor 91-1 is connected to coating 91. Intermediate section 97 of button 93 is in registration with reference electrode 37 on diaphragm 27. A conductor 100 is connected to coating 39 on diaphragm 27. An annular shaped spacer 101 made of nonconductive material, such as mylar, surrounds button 93. Spacer 101 is glued to the bottom of plate 89 and diaphragm 27 is glued to the bottom surface of spacer 101.

In use, reference electrode 37 is brought into uniform compliance with specimen 11 by applying pressure to plate 89, with the pressure being transmitted from plate 89 to diaphragm 27 through button 93.

As can be seen, button 93 serves simultaneously the four functions of a) transmitting uniform pressure to diaphragm 27 with minimal displacement b) allowing light to be passed to transparent reference electrode 37 c) confining the modulated light to a limited area of reference electrode 37 and d) providing an easy to assemble and low parasitic electrical connection to reference electrode 37 from coating 91.

Figure 10:
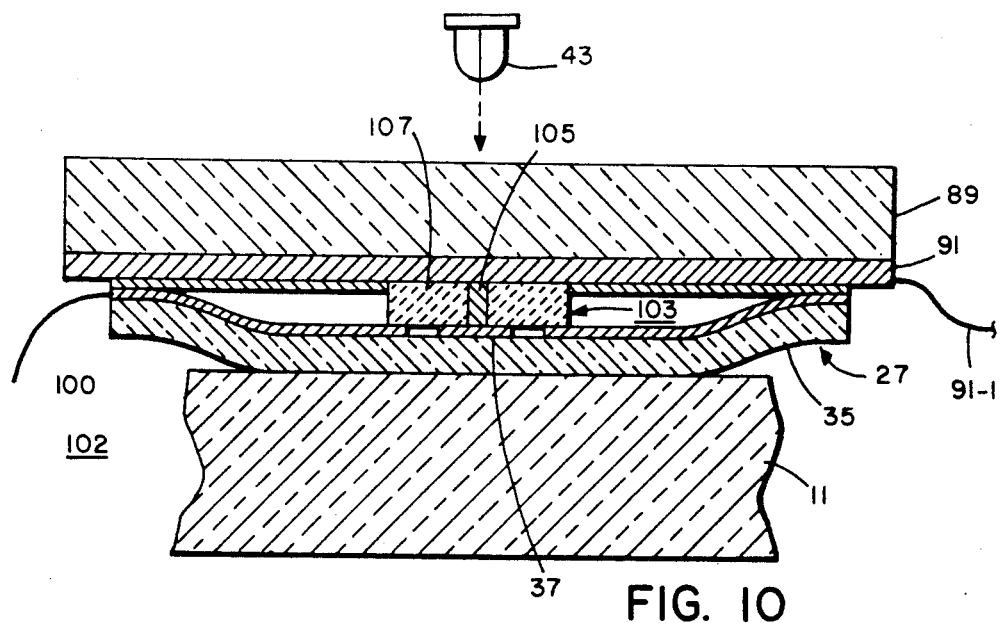
FIG. 10 is a section view of a modification of the embodiment shown in FIG. 8.
Figure 11:
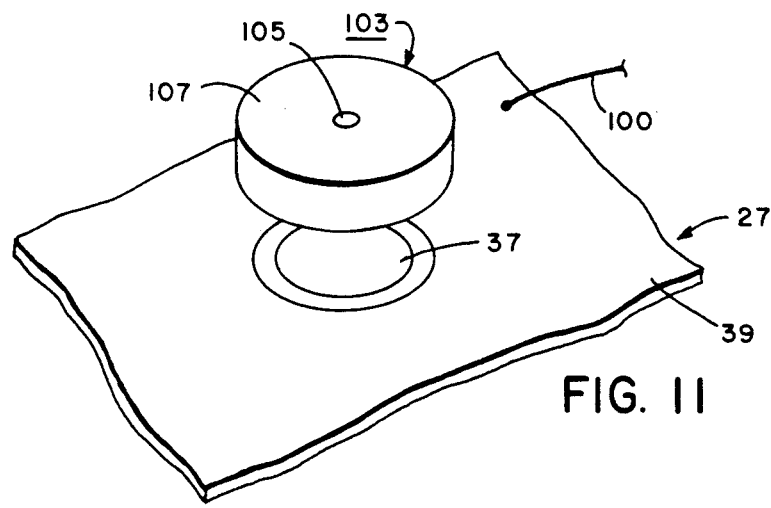
FIG. 11 is an exploded perspective view of the button and diaphragm portions of the reference electrode probe assembly shown in FIG. 10.

In FIG. 10 there is shown a modification of the reference electrode assembly shown in FIG. 8, the modification being identified by reference numeral 102. Also shown is specimen 11 and light source 43. As can be seen, modification 102 includes a button 103 having an inner section 105 which is circular in cross-section and made of a conductive elastomer and an outer section 107 which is annular in cross-section. Outer section 107 surrounds inner section 105 and is made of a transparent, insulating elastomer. Button 103 is mounted in place between plate 89 and diaphragm 27. Inner section 105 is in contact with reference electrode 37 and serves to conduct the SPV signals from reference electrode to coating 91. As can be appreciated, modification 102 differs from modification 87 only in the construction of the button. In modification 102 button 103 is made from only two different materials while in modification 87 button 93 is made from three different materials. A perspective view of button 103 and diaphragm 92 are also shown in FIG. 11. Assembly 102 is used in the same way as assembly 87.

Figure 12:
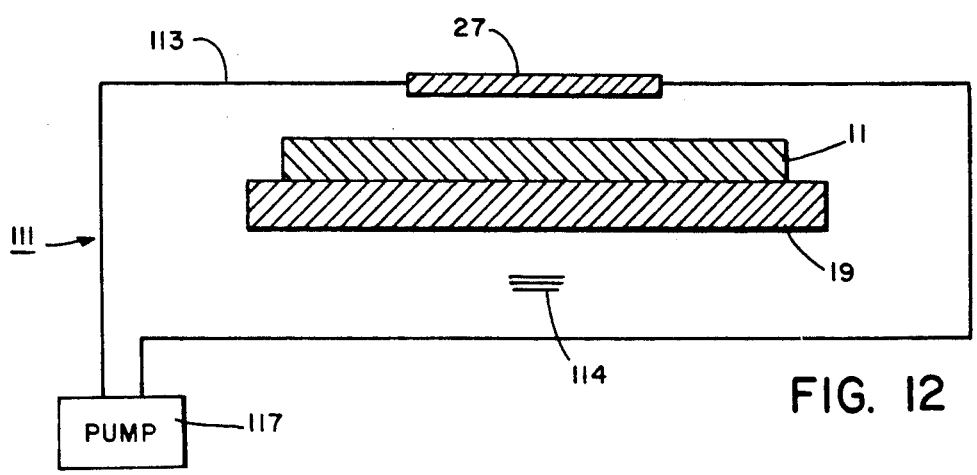
FIG. 12 is a schematic representation of another modification of the arrangement shown in FIG. 1 for picking up the SPV signals and supporting the specimen.

In FIG. 12 there is shown another arrangement for holding the specimen and maintaining uniform compliance as the SPV signals are being made, the arrangement being identified by reference numeral 111. Also shown in FIG. 12 is a specimen 11. As can be seen, specimen 11 is seated on a back electrode 19 which is located inside a chamber 113 filled with a fluid 114 such as air. An outlet 115 on chamber 113 is connected to a vacuum pump 117 which is controlled by computer 57. Chamber 113 includes a diaphragm 27 which is formed as a window on chamber 113. In use, when SPV measurements are to be made, a negative pressure is created inside chamber 113 by pump 117, the negative pressure pulling diaphragm in toward specimen 11 so that reference electrode 27 is brought into contact with specimen 11 and held in uniform compliance.

Figure 13:
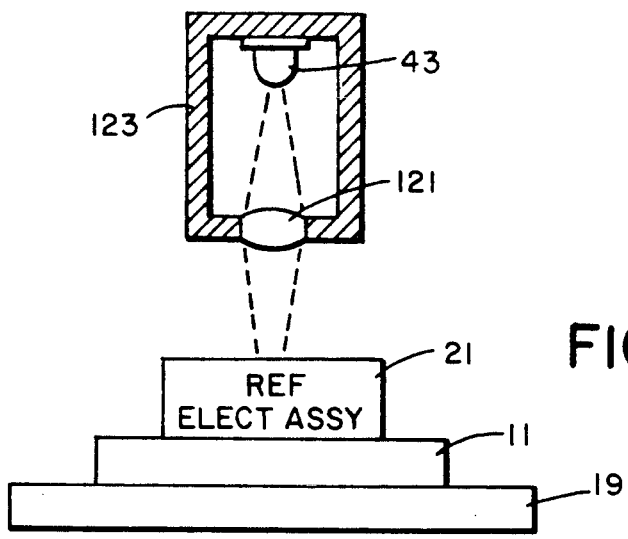
FIG. 13 is a schematic representation of another arrangement for illuminating the specimen, picking up the SPV signals and supporting the specimen.

In FIG. 13 there is shown another arrangement for illuminating the specimen and for picking up the SPV signals and supporting the specimen during the measurement process. A light source 43 and a focusing lens 121 are fixedly mounted in a frame 123. Frame 123 is fixedly positioned (by means not shown) in the Z direction at a distance so that light from source 43 is brought to focus at specimen 11 and is movable in the x and y directions (by any suitable means, not shown) so that the light spot from source 43 can be made to scan across the portion of specimen 11 adjacent reference electrode 37 and thus illuminate a very small area at a time. Specimen 11 is seated on a support 19.

Figure 14:
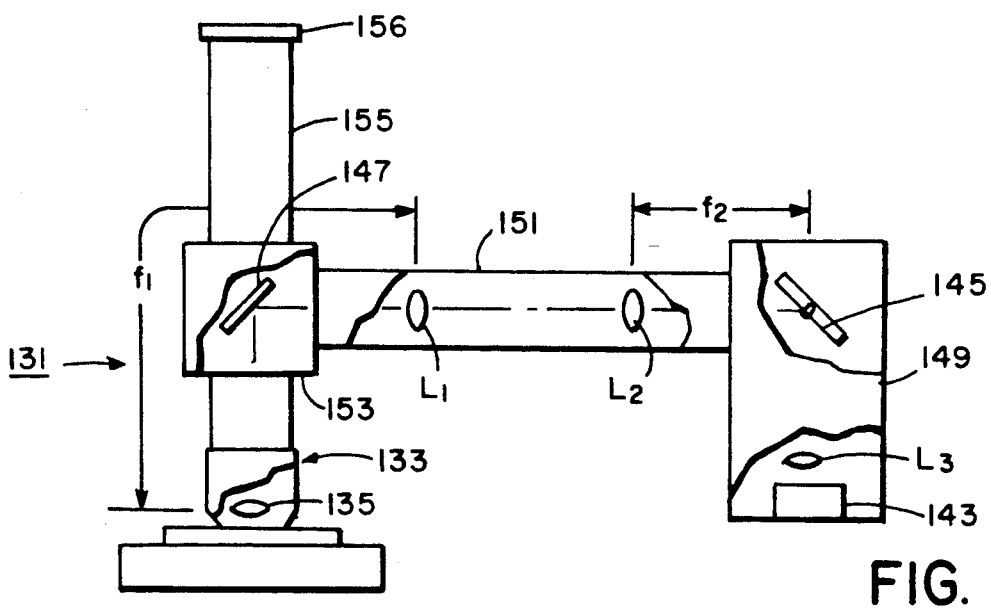
FIG. 14 is a schematic representation of another arrangement for illuminating the specimen, picking up the SPV signals and supporting the specimen.
Figure 15:
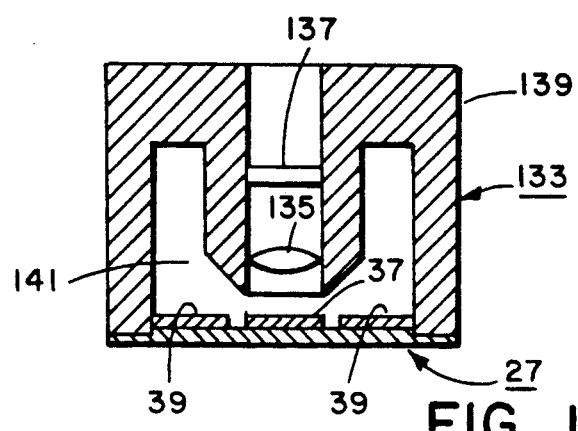
FIG. 15 is a schematic of the reference electrode assembly in the apparatus in FIG. 14.

In FIG. 14 there is shown another arrangement for illuminating the specimen and for sensing the SPV signals and supporting the specimen during the measurement process, the arrangement being identified by reference numeral 131. System 131 include a reference electrode assembly 133 which is also shown separately in FIG. 15. As can be seen in FIG. 15, a focusing lens 135, a diaphragm 27 and a window 137 are mounted on a common frame 139 which is shaped to define an air tight chamber 141 which is under pressure. Returning back to FIG. 14, a beam of light from a source 143 is collimated by a lens $L_3$, deflected off a scanning mirror 145 driven by any mechanical means (not shown), passed through a pair of lens $L_1$ and $L_2$ which are spaced as shown, then deflected off a semitransparent mirror 147 into reference electrode assembly 133 where it is brought to focus as a small spot on specimen 11. Since mirror 145 is scanning, the spot of light is not stationary but rather will scan over the surface of specimen 11. Source 143, lens $L_3$ and mirror 145 are mounted in a housing 149. Lenses $L_1$ and $L_2$ are mounted in housing 151. Mirror 147 is mounted in a housing 153. Housing sections 149, 151 and 153 are fixed relative to each other. A housing 155 which is tubular in shape and includes assembly 133, which functions as a microscope objective, at one end and an eyepiece 156 at the other end is movable vertically relative to housing 151 to permit assembly 133 to be brought into contact with specimen 11. Light source 143 may comprise an LED 157 and a beam expander 159.

Figure 16:
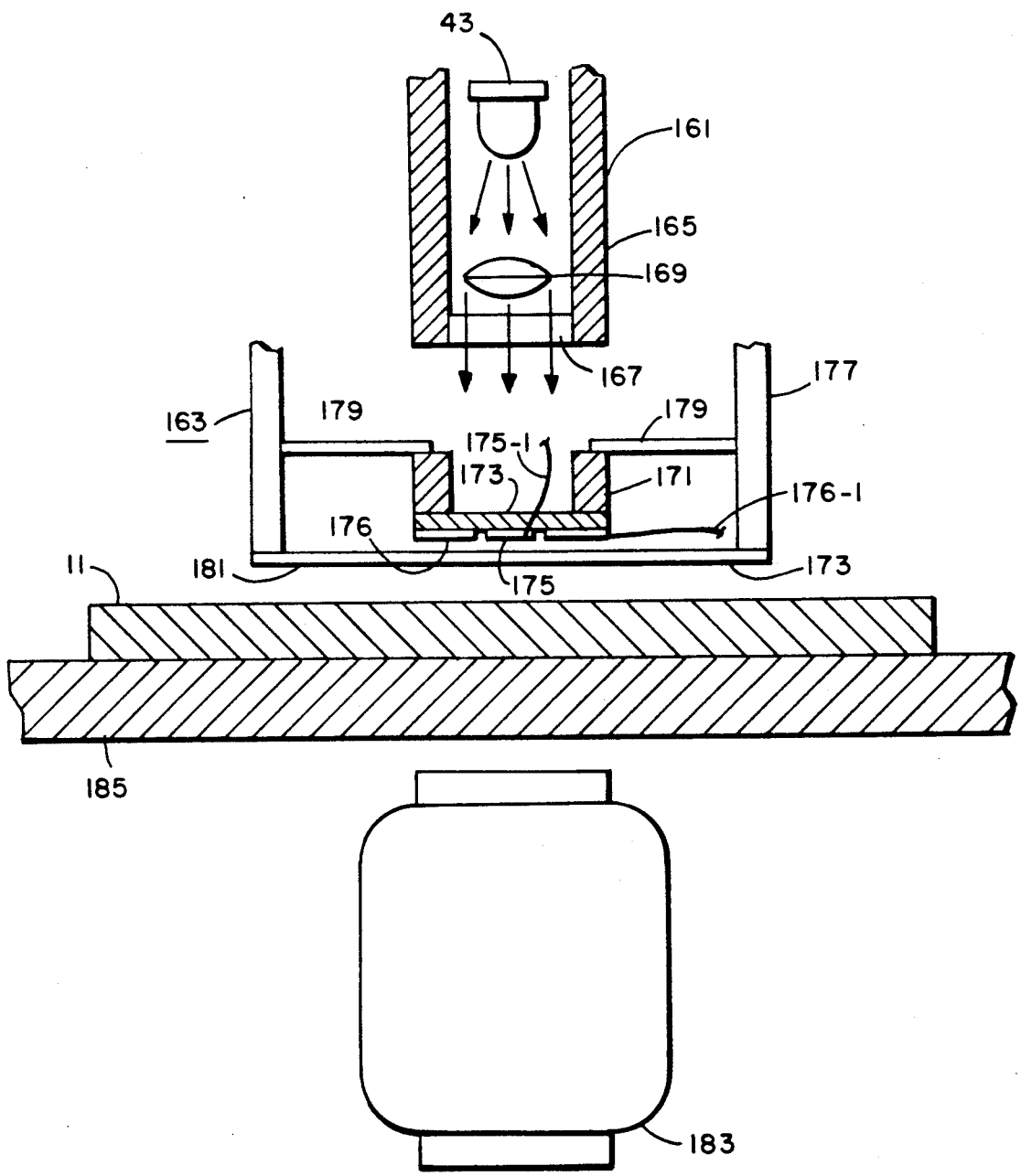
FIG. 16 is a schematic representation of another arrangment for illuminating the specimen. supporting the specimen and picking up the SPV signals.

In FIG. 16 there is shown another arrangement for illuminating the specimen along with another arrangement for sensing the SPV 22 signals and supporting the specimen during the measurement process. Also shown is specimen 11. There is a light source assembly 161 and a reference electrode assembly 163. Light source assembly 161 includes an electrically shielded housing 165 having a window 167, a light source 43, and a collimating lens 169 for collimating the beam of light from source 43 are fixedly mounted (by means not shown) in housing 165. Reference electrode assembly 163 includes a ring 171 made of iron or other material which is conductive and magnetic. A glass plate 173 is glued to ring 171. Coatings defining a reference electrode 175 and a guard electrode 176 are deposited on the bottom surface of plate 173. Ring 171 is fixedly attached to a frame 177 by a flexible annularly shaped suspension 179 made of a nonmagnetic material. A sheet of flexible transparent dielectric material 181, such as mylar, is attached to frame 177 below plate 173.

An electromagnet 183 is disposed underneath a support 185. Support 185 is made of any rigid, conductive, nonmagnetic material, such as aluminum.

Specimen 11 is seated on support 185. Conductors 175-1 and 176-1 are attached to electrode 175 and 176, respectively. In use, reference electrode assembly 163 is brought close to specimen 11. Electromagnet 183 is then energized, creating a magnetic field which pulls ring 171 downward by magnetic attraction, carrying with it plate 173 and sheet 181. As a result, plate 173 and sheet 181 are pressed evenly and controllably against specimen 11, sheet 181 electrically separating plate 173 from specimen 11. If desired, a guard electrode can also be formed on plate 173.

Figure 17:
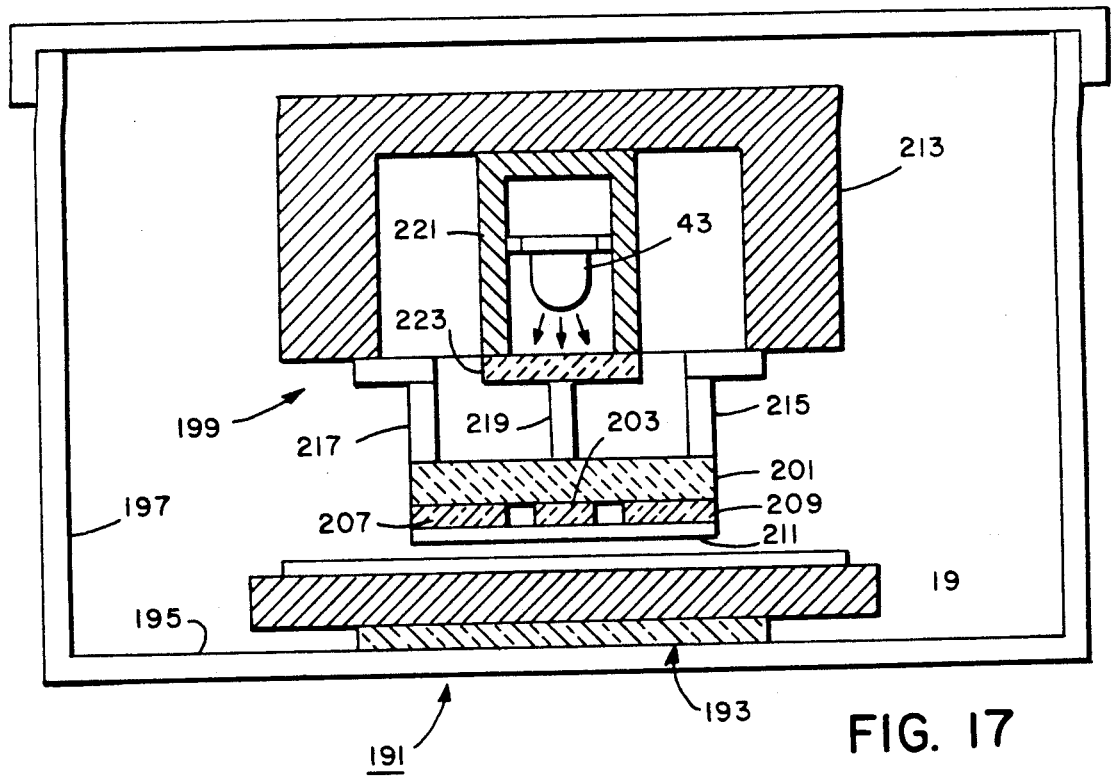
FIG. 17 is a schematic representation of another version of the reference electrode assembly according to this invention.

In FIG. 17 there is shown another arrangement for illuminating the specimen and for sensing the SPV signals and supporting the specimen during the measurement process, the arrangement being designated by reference numeral 191.

Figure 18:
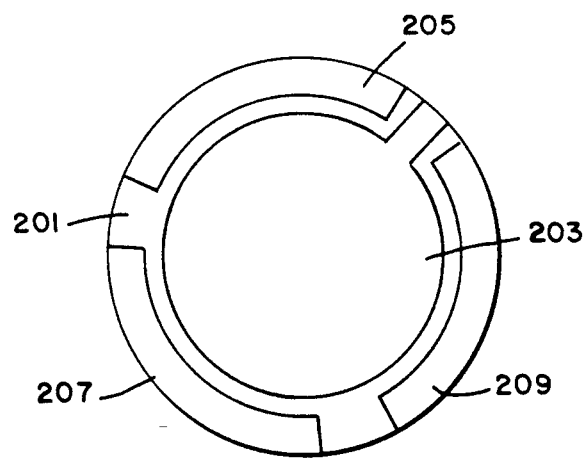
FIG. 18 is a plan view taken from the bottom of the glass plate shown in FIG. 17.

A support plate 19 is mounted on an insulator 193 which is made of rigid material such as glass. Insulator 193 is seated on the floor 195 of a gas tight enclosure 197 which is flashed periodically with an inert gas. The specimen 11 being examined is seated on support plate 19. A reference electrode assembly 199 is also disposed in enclosure 197. Reference electrode assembly 199 includes a rigid transparent plate 201 of nonconductive material such as glass which is conductively coated on its bottom surface. The conductive coating is shaped, as shown in FIG. 18, to define a central pickup area 203 and three edge pickup areas 205, 207 and 209. The coating making up area 203 is transparent. Central pickup area 203 serves as a reference electrode while edge areas 205, 207 and 209 serve as pickups to sense the distance from the bottom of plate 201 to specimen 11. A sheet 211 of transparent dielectric material, such as mylar, which serves as an insulator is attached to the bottom of plate 201. Alternately, the insulator could be a coating on plate 201. Plate 201 is attached to a support 213 by a set of three piezoelectric actuators 215, 217 and 219 which are used to maintain the desired separation and parallelism between reference electrode 203 and specimen 11. Support 213 is movably mounted (by means not shown) inside enclosure 197 so that reference electrode 203 can be placed over any desired area on specimen 11. A light source 43 for illuminating specimen 11 is fixedly mounted on support 213 above plate 201. Light source 43 is enclosed in an electrically shielded housing 221 having a window 223 at the bottom. When SPV measurements are being made, insulator 211 is not in contact with specimen 11 but, rather, is spaced above specimen 11 a predetermined distance. Pickups 205, 207 and 209 are used to sense the distance between plate 201 and specimen 11 and actuators 215, 217 and 219 are used to maintain the distance and keep reference electrode 203 (locally) parallel with specimen 11.

Figure 19:
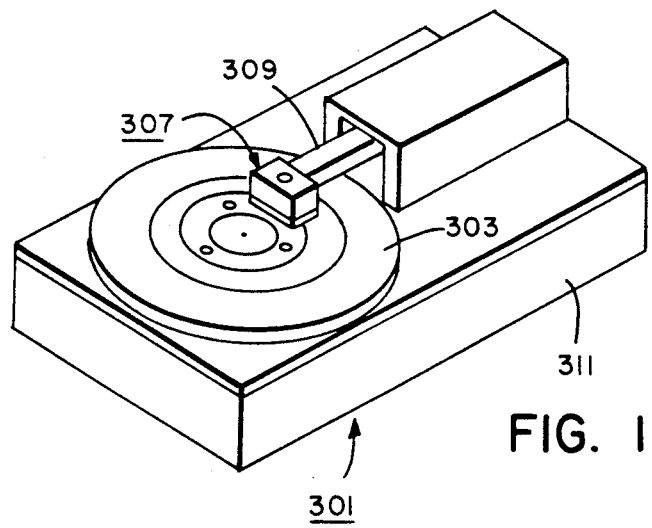
FIG. 19 is a simplified perspective view of an implementation of an apparatus constructed according to this invention.
Figure 20:
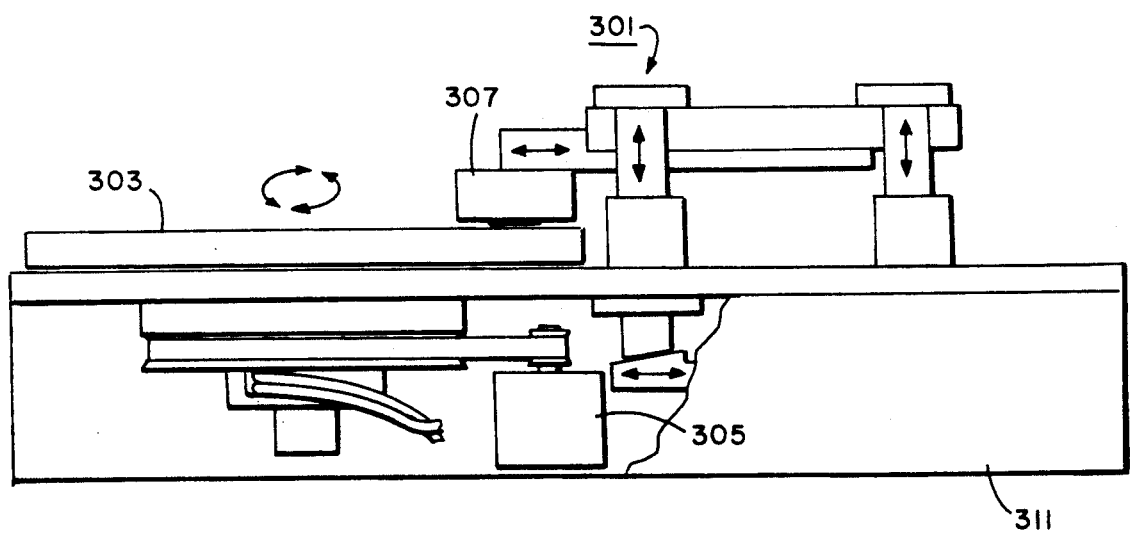
FIG. 20 is a side elevation view of the apparatus shown in FIG. 19.

In FIGS. 19 and 20 there are shown simplified representations of an apparatus 301 for implementing this invention. Apparatus 301 includes a turntable 303 which is driven by a motor 305. Turntable 305 is made of conductive material. A probe assembly 307 is attached to an arm 309 which is movable in the x and z directions. The electronics (including a computer) is disposed in a base housing 311. Probe assembly 307 may comprise reference electrode assembly 21 and light source 43.

Figure 21:
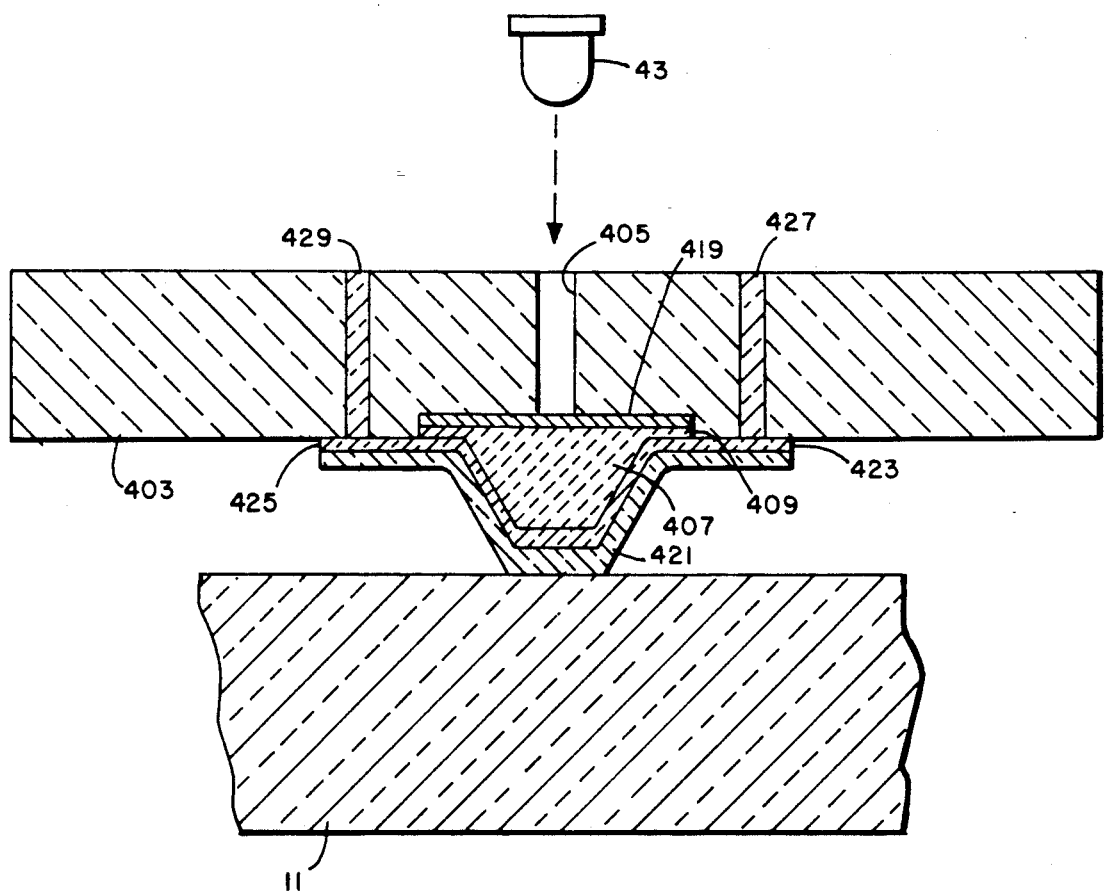
FIG. 21 is a section view of another modification of the embodiment shown in FIG. 8.

Referring now to FIG. 21, there is shown another modification of the reference electrode assembly shown in FIG. 8, the modification being identified by reference numeral 401.

Figure 22:
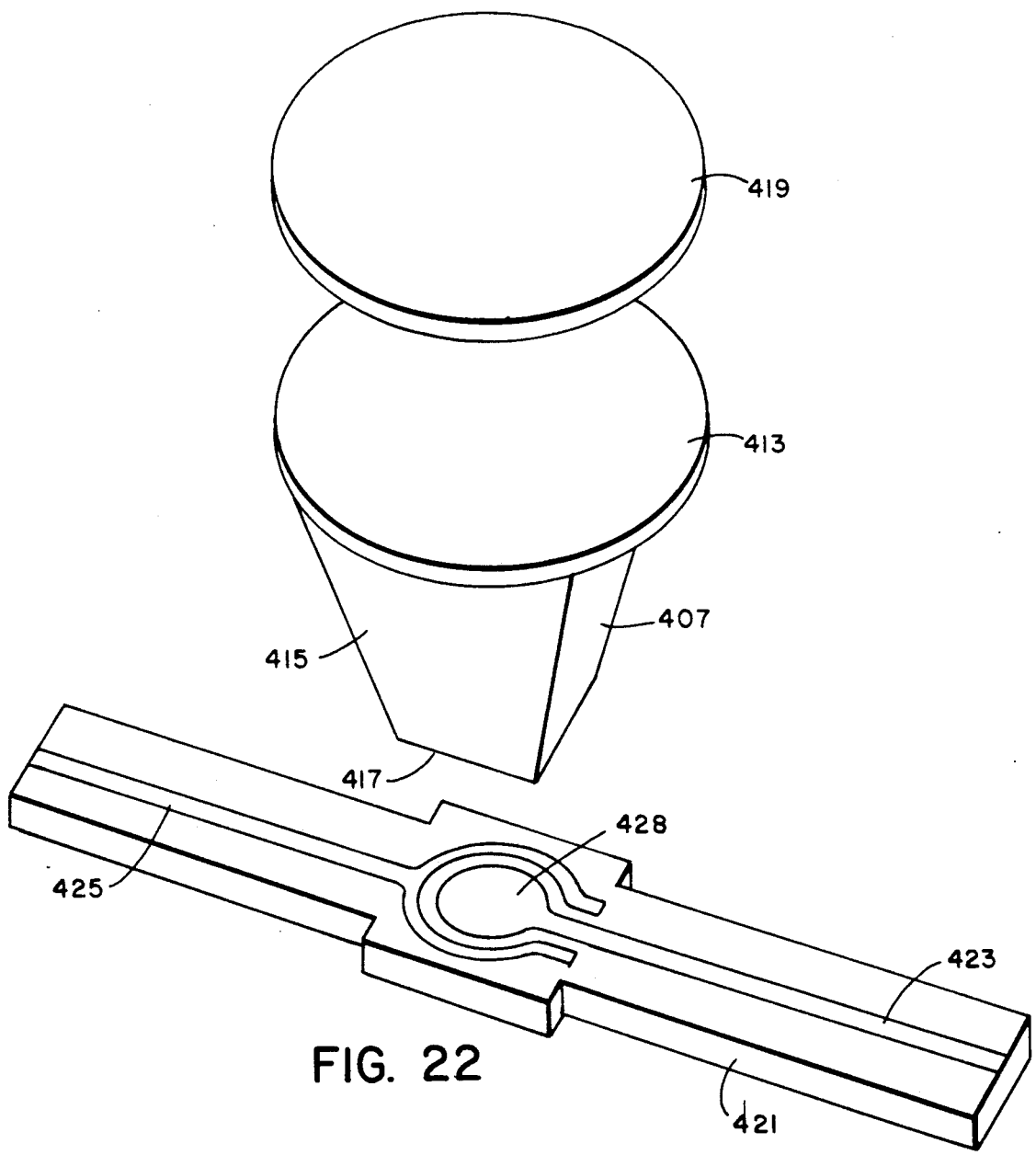
FIG. 22 is an exploded perspective view of portions of the reference electrode probe assembly shown in FIG. 21.
Figure 23:
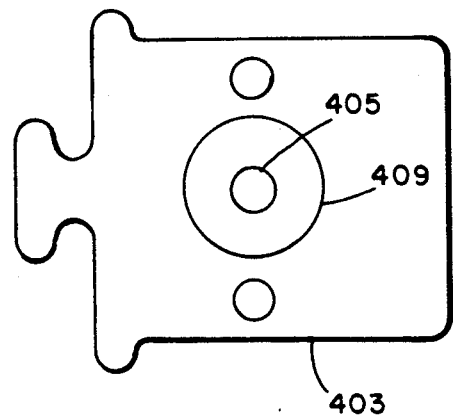
FIG. 23 is a plan view taken from the bottom of the support shown in FIG. 21.

Reference electrode assembly 401, parts of which are also shown in FIGS. 22 and 23, includes a flat plate 403 made of bakelite or other rigid nonconductive material. A hole 405 is provided in plate 403 to allow light from source 43 to pass through to specimen 11. If plate 403 is made of a rigid nonconductive material which is transparent rather than opaque as is the case with bakelite, then hole 405 is not necessary and may be omitted. A flexible and deformable buttom 407 is fixedly secured by glue, not shown, in a recess 409 formed on the bottom side 411 of plate 403. Buttom 407 is made of a transparent insulating elastomer, such as silicone rubber and includes a top 413 which is substantially circular in cross-sectional shape, a main body portion 415 which is in the shape of a part of an inverted pyramid and a bottom 417 which is rectangular in shape. A flat rigid disc 419 of transparent material is positioned between plate 403 and buttom 407 to prevent buttom 407 from extending into hole 405 when plate 403 is pushed downward, (by external means, not shown) toward specimen 11 as will hereinafter be described. An example of a material from which disc 419 may be made is a plastic marketed by General Electric Company under the registered trademark LEXAN ®. A film 421, made of a flexible insulating material, such as Mylar, is fixedly attached to plate 403 and to buttom 407 by glue (not shown). First and second conductive coatings 423 and 425, respectively are formed on the top side 427 of film 421. First coating 423 is transparent, is shaped to include an end portion 428 which is positioned underneath the bottom 417 of buttom 407 and serves as a reference electrode. Coating 425 is spaced from coating 423, is shaped to surround at least end portion 428 of coating 423 and serves as a guard electrode. Both coatings may be made of gold. A pair of electrical contacts 427 and 429 are press fit into openings formed in plate 403, contact 427 being electrically coupled to coating 423 and contact 429 being electrically coupled to coating 425.

In use, reference electrode 423 is brought into uniform compliance with specimen 11 over the area underneath bottom side 417 by applying pressure to plate 403 from an external source, the pressure being transmitted from plate 403 to film 421 through sheet 419 and buttom 407.

The embodiments of the present invention described above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A reference electrode assembly for use in an apparatus for making surface photovoltage measurements of a specimen of semiconductor material, said reference electrode assembly comprising:
    a. a plate made of rigid nonconductive material,
    b. a buttom made of flexible, deformable, insulating material mounted on said rigid plate,
    c. a film of insulating material mounted on said buttom, and
    d. a first coating of conductive material on said film between said film and said button, said coating of conductive material constituting a reference electrode.

2. The reference electrode assembly of claim 1 and wherein said button is fixedly secured to said plate.

3. The reference electrode assembly of claim 2 and wherein said film is fixedly secured to said button.

4. The reference electrode assembly of claim 3 and wherein said film is fixedly secured to said plate.

5. The reference electrode assembly of claim 4 and wherein said button is made of silicone rubber.

6. The reference electrode assembly of claim 5 wherein said button is in the shape of a portion of a pyramid.

7. The reference electrode assembly of claim 1 and further including a second coating of conductive material on said film between said film and said button and spaced from said first coating, said second coating constituting a guard electrode.

8. The reference electrode assembly of claim 1 and wherein said plate is made of an opaque material and has an opening through which a beam of light may be passed.

9. The reference electrode assembly of claim 8 and wherein said plate is made of bakelite.

10. The reference electrode assembly of claim 8 and further including a disc of rigid material between said plate and said button and aligned with said opening in said plate.

11. The reference electrode assembly of claim 16 and wherein said disc is made of LEXAN ®.

12. The reference electrode assembly of claim 1 and wherein the film is transparent.

13. The reference electrode assembly of claim 12 and wherein the film is mylar.

14. The reference electrode assembly of claim 1 and further including a first contact on said support in contact with said reference electrode.

15. The reference electrode assembly of claim 14 and further including a second contact on said support in contact with said guard electrode.

16. The reference electrode assembly of claim 1 and wherein said plate is made of transparent material.

17. A reference electrode assembly for use in an apparatus for making surface photovoltage measurements of a specimen of semiconductor material, said reference electrode assembly comprising:
    a. a flat rigid plate, made of nonconductive material and having a hole through which light can pass,
    b. a button made of flexible deformable transparent insulating material fixedly mounted on said flat rigid plate,
    c. a flat rigid disc of transparent material disposed between said flat rigid plate and said button and extending over said hole in said flat rigid plate,
    d. a film of transparent insulating material mounted on said button,
    e. a first coating of conductive material on said film between said film and said button, said first coating of conductive material being transparent and constituting a reference electrode, and
    f. a second coating of conductive material on said film between said film and said button and electrically separated from said first coating, said second coating constituting a guard electrode.

18. The reference electrode assembly of claim 17 and wherein the flat rigid plate is made of opaque material.

19. A reference electrode assembly for use in an apparatus for making surface photovoltage measurements of a specimen of semiconductor material, said reference electrode assembly comprising:
    a. a flat rigid plate made of nonconductive transparent material,
    b. a button made of flexible deformable transparent insulating material fixedly mounted on said flat rigid plate, c. a film of transparent insulating material mounted on said button, d. a first coating of conductive material on said film between said film and said button, said first coating of conductive material being transparent and constituting a reference electrode, and e. a second coating of conductive material on said film between said film and said button and electrically separated from said first coating, said second coating constituting a guard electrode.

* * * * *